United States Patent
Fisher

(10) Patent No.: US 6,380,785 B2
(45) Date of Patent: *Apr. 30, 2002

(54) METHOD AND APPARATUS FOR ELIMINATING SHOOT-THROUGH EVENTS DURING MASTER-SLAVE FLIP-FLOP SCAN OPERATIONS

(75) Inventor: Rory L. Fisher, Ft. Collins, CO (US)

(73) Assignee: Agilent Technologies, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,343

(22) Filed: Feb. 1, 1999

(51) Int. Cl.[7] .................................. H03H 11/26
(52) U.S. Cl. .................... 327/269; 327/284; 327/295; 327/415
(58) Field of Search ................... 327/261, 269, 327/271, 284, 292, 407, 291, 295, 415, 202; 377/110, 84

(56) References Cited

U.S. PATENT DOCUMENTS

| | | | | |
|---|---|---|---|---|
| 4,726,045 A | * | 2/1988 | Caspell et al. | 377/110 |
| 4,745,310 A | * | 5/1988 | Swapp | 327/279 |
| 5,670,904 A | * | 9/1997 | Moloney et al. | 327/277 |
| 5,771,240 A | | 6/1998 | Tobin et al. | 714/724 |
| 5,878,055 A | | 3/1999 | Allen | 714/744 |

* cited by examiner

*Primary Examiner*—Timothy P. Callahan
*Assistant Examiner*—Minh Nguyen
(74) *Attorney, Agent, or Firm*—Alexander Neudeck

(57) ABSTRACT

A novel method and apparatus for eliminating shoot-through events during master-slave flip-flop scan operations to allow minimal test time of electronic circuit components is presented. Shoot-through scan problems introduced by loading mismatches on the TAP master and slave clock signal lines are solved by scanning an appropriate value into a programmable register, which increases the delay from master clock signal TCKM off to slave clock signal TCKS on and from slave clock signal TCKS off to master clock signal TCKM on.

6 Claims, 5 Drawing Sheets

METHOD AND APPARATUS FOR ELIMINATING SHOOT-THROUGH EVENTS DURING MASTER-SLAVE FLIP-FLOP SCAN OPERATIONS

FIELD OF THE INVENTION

The present invention pertains generally to digital test circuitry, and more particularly to a method and apparatus for eliminating shoot-through events during master-slave flip-flop scan operations while incorporating minimal test time.

BACKGROUND OF THE INVENTION

The testing of electrical circuits is an essential portion of the process involved in the design and manufacture of electrical circuits. One testing technique often employed in the testing of electrical circuits is the use of a test access port (TAP). The use of a TAP allows signals to be serially scanned in and out of an integrated circuit (IC) to test the circuit for functional defects. The TAP architecture is well known in the art and has been defined in an Institute of Electrical and Electronic Engineers (IEEE) standard 1149.1-1990.

FIG. 1 is a block diagram of a typical prior art integrated circuit (IC) 100 containing TAP circuitry 120. Dedicated TAP pins TDI 112, TCK 114, TDO 116, and TMS 118 are provided to allow communication from an external tester to a set of internal scan registers 160a, 160b, . . . , 160n, and 108. Test Clock (TCK) pin 114 and Test Mode Select (TMS) pin 118 are both coupled to a Test Access Port (TAP) controller 130, and are used to implement a communication protocol, preferably the "JTAG" (Joint Test Action Group) protocol which is described in detail in the IEEE/ANSI Standard 1149.1-1990.

IC 100 includes internal logic 106 that is coupled to receive input data via input pins 102 and to output output data via output pins 104. Internal registers and/or test nodes of interest are coupled to internal scan chains 160a, 160b, . . . , 160n. Each scan chain 160a, 160b, . . . , 160n comprises one or more scan chain cells 110. Each scan chain cell 110 is typically implemented using a master-slave flip-flop. In the illustrative embodiment, IC 100 also includes a boundary scan chain 108. Boundary scan testing is a well-known testing technique in which each IC component that is part of a larger circuit under test is constructed with a set of shift registers placed between each device pin and the component's specific internal logic system and which allows an entire circuit to be accurately tested by scanning only the boundary pins of the components of the circuit under test. In the illustrative embodiment, each input pin 102 and output pin 104 of interest is coupled to a separate boundary scan chain cell 110, which are coupled serially in a loop configuration to form boundary scan register 108. At any given time, Test Data In (TDI) pin 112 and Test Data Out (TDO) pin 116 are each switchably coupled to one of the instruction register 140, one of the internal scan registers 160a, 160b, . . . , 160n, or boundary scan register 108.

TAP instruction register 140 is used to set the mode of operation of the TAP 120. In operation, instructions are loaded into instruction register 140 under the control of TMS pin 118 and TCK pin 114 via TDI pin 112. The instruction present in instruction register 140 determines which one of the instruction register 140, one of the internal scan registers 160a, 160b, . . . , 160n, or boundary scan register 108, is coupled between the TDI pin 112 and TDO pin 116. Data is shifted serially into the currently selected register 140, 160a, 160b, . . . , 160n, or 108 via TDI pin 112 in synchronization with a clock signal received on TCK pin 114.

Scan chain cells 110 are latches, typically implemented with a master-slave flip-flop, illustrated at 200 in FIG. 2(a). When scanning serial data into master-slave flip-flops 200, data movement takes place on each edge of the test clock TCK (shown in accompanying FIG. 2(b)). This movement takes place upon assertion of two signals generated by the TAP from the test clock signal TCK—master clock TCKM and slave clock TCKS. By IEEE 1149.1 specifications, data is required to be shifted on the falling edge of test clock TCK. When master clock TCKM is asserted, serial data is loaded one bit at a time from the input 211 of the flip-flop 200 into the master latch 210 of each flip-flop 200. When the slave clock TCKS is asserted, data stored in each master latch 210 is copied into its respective slave latch 220 and driven from the output S_OUT 225 of the slave latch 220 to the input M_IN 211 of the master latch 210 of the next boundary scan chain cell 110 in the scan chain 108.

Care must be taken when designing this test circuitry. If at any moment the master clock TCKM and slave clock TCKS are both above the trip-point, shown at "T" for signals TCKM and TCKS in FIG. 2(b), of the latch enable gates 212, 222, data will "shoot-through" multiple scan chain cell latches 110 in the scan chain 160a, 160b, . . . , 160n, 108, corrupting the previously-stored scan data. For this reason, most test circuitry implements delay-generating logic between the master and slave clock signal lines to ensure that the master clock TCKM and slave clock TCKS do not overlap. The time when neither master clock TCKM or slave clock TCKS is asserted is commonly referred to as "dead-time". This is illustrated in FIG. 2(b). If an excessive amount of dead-time is introduced between the master and slave clock signals TCKM and TCKS, the test clock TCK frequency must be decreased, increasing the amount of test time per circuit under test. This can be very expensive on high-volume manufacturing test lines.

Shoot-through problems occur more frequently when the load on the master and slave clock signals TCKM and TCKS is high, as often is the case when driving long scan chains.

Prior art solutions to shoot-through problems introduce by excessive loading on the master and slave clock lines include introducing a fixed delay between the master clock TCKM and slave clock TCKS. However, this solution is problematic if the fixed delay is set to introduce too large of an amount of dead-time between the master and slave clocks since the frequency of the test clock TCK is forced to be slower. The slower test clock frequency increases the amount of test time and thus the cost of the test. If the delay value is set too low, shoot-through conditions will occur in the scan chains where loading mismatches occur.

Another prior art solution involves the use of test module satellites. This method requires the installation of test modules, which buffer the test signals from the TAP and generate the non-overlapping clocks local to each block. This method greatly reduces the risk of shoot-through, but requires that test modules be generated, sized correctly, verified, and placed in each block of the circuit, increasing both design time and overall area of the chip.

Another solution to the problem is the use of long-route feedback. In this method an output signal from the TAP is routed around the periphery of the integrated circuit and returned as an input to the TAP. This delay introduced by the long trace represents a fixed delay which acts as the dead-time between the master and slave clock signals TCKM and TCKS of the TAP. The disadvantage of the implementation is two-fold. First, if the delay is too long, tester time is unnecessarily increased; if the delay is too short, shoot-through is introduced. Second, the long trace inherits large inductive properties due to its loop-like nature. The trace must therefore carry extra width, taking up more area on the chip. Since the trace also exists in the outer-most part of the core, extra care must be taken that the top-level router does not route on top of the trace. If the long-route is hand-placed after the top-level route, highly congested areas of the chip will be difficult to pass through.

Each of the prior art solutions to shoot-through problems in master-slave latches results in other problems as described above. Accordingly, a need exists for a method and apparatus which allows a test engineer to calibrate the amount of dead-time, thus eliminating shoot-through, while allowing for the fastest possible test time over process-varying silicon.

SUMMARY OF THE INVENTION

The present invention is a novel method and apparatus for eliminating shoot-through events during master-slave flip-flop scan operations while incorporating minimal test time. Shoot-through scan problems introduced by loading mismatches on the TAP master and slave clock signal lines are solved by scanning an appropriate value into a programmable register, which increases the delay from master clock signal TCKM off to slave clock signal TCKS on and from slave clock signal TCKS off to master clock signal TCKM on. Shoot-through scan problems introduced by open-loop routes can also be eliminated by increasing the delay between master and slave lines.

In accordance with one embodiment, the master-slave dock generating circuit of the invention includes a programmable delay circuit which generates a delayed version of a test clock signal, the delay being proportional to a programmed delay value. The delayed test clock signal is used by a clock signal generating generator circuit which generates a master clock signal and a slave clock signal based on the test clock signal and the delayed version of the test clock signal. The programmable delay circuit comprises a delay selector circuit and a delay generator circuit. The delay selector circuit is responsive to the programmed delay value for generating an adjustable delay control signal. The delay generator circuit generates the delayed clock signal in response to and in proportion to the adjustable delay control signal. The programmed delay value is preferably stored in a delay register that is programmable via TAP control circuitry. In the illustrative embodiment, the delay selector circuit is implemented using a 3:8 decoder whose input is coupled to a 3-bit programmable delay register, and the delay generator circuit comprises a set of eight delay elements coupled in series, each of which produces a successively more delayed version of the test clock signal. The delay selector circuit determines which of the successively delayed versions of the test clock signal is output as the delayed clock signal.

A first NOR gate is coupled to receive the test clock signal and delayed clock signal to assert a master clock signal only when the test clock signal and delayed clock signal are both asserted. A second NOR gate is coupled to receive an inverted version of the test clock signal and the delayed clock signal and to assert a slave clock signal only when the test clock signal and delayed clock signal are both deasserted.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and apparatus for eliminating shoot-through events during master-slave flip-flop scan operations while incorporating minimal test time is described in detail hereinafter. While the invention is described in the context of TAP protocol signals, it will be appreciated by those skilled in the art by those skilled in the art that the programmable delay circuit may be employed in any electronic circuit requiring a dead-time between alternating clock signals.

Figure 3A:
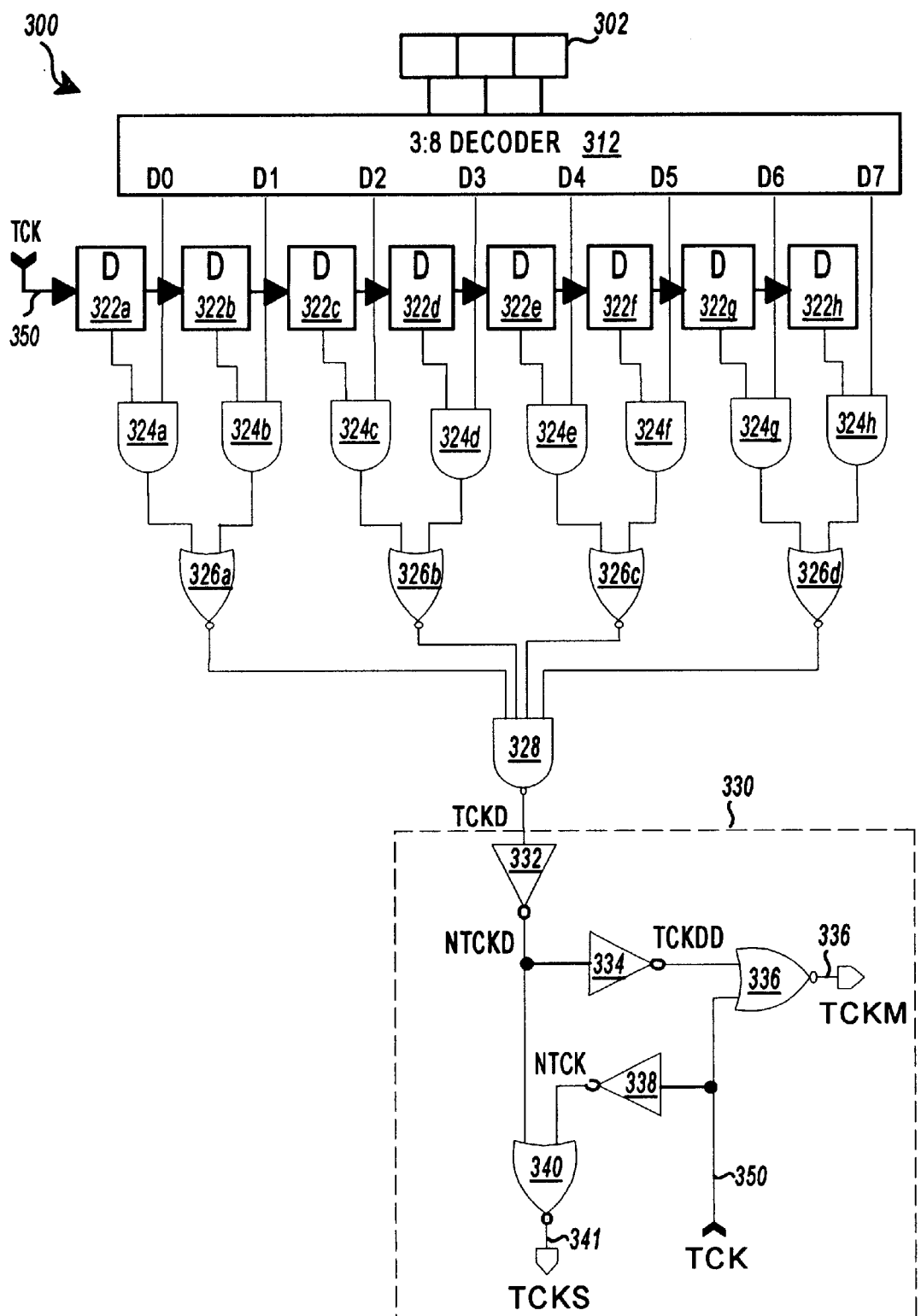
FIG. 3(a) is a schematic diagram of a programmable delay apparatus in accordance with the invention.

FIG. 3(a) is a schematic diagram of a master-slave clock generating circuit which eliminates shoot-through events for use in generating master clock TCKM and slave clock TCKS from test clock TCK. Master-slave clock generating circuit 300 includes a programmable delay circuit 340 and a clock signal generating generator circuit 330. Programmable delay circuit 340 includes a delay register 302, a delay selector circuit 310, and a delay generator circuit 320. In the illustrative embodiment, delay register 302 is programmable via TAP control circuitry. An instruction for programming the delay register 302 is loaded into the TAP instruction register 140 via appropriate control of the TMS, TCK and TDI signals of a boundary scan component. This instruction causes the TDI input 112 to be coupled to the delay register 302, such that, via appropriate control of the TMS, TCK and TDI signals, the desired delay is then shifted into the delay register 302 from the TDI line 112.

In the illustrative embodiment, delay selector circuit 310 comprises a 3:8 decoder 312, and delay generator circuit 320 comprises eight delay elements 322a, 322b, 322c, 322d, 322e, 322f, 322g, and 322h, and some back-end combinational logic. The contents of the delay register 302 are used as input to the 3:8 decoder 312. The 3-bit value determines the amount of dead-time between the master and slave clocks TCKM and TCKS, where "0" (i.e., "000$_{bin}$") represents the minimal amount of dead-time and "7" (i.e., "111$_{bin}$") represents the maximum amount of dead-time.

Test clock signal TCK 350 is input into a serially coupled chain of delay elements 322a–322h. A set of eight AND gates 324a–324h, one each corresponding to a respective delay element 322a–322h and a respective output D0–D7 of decoder 312. Each AND gate 324a–324h is coupled to receive the delayed test clock signal output from its corresponding delay element 322a–322h and the output select signal from its corresponding decoder output line D0–D7. The 3-bit value scanned into delay register 302 is decoded by the 3:8 decoder 312 such that only one output D0, D1, . . . , D7 is asserted. Accordingly, only one AND gate 324a–324h asserts a proportional delay time after the test clock TCK asserts. An eight-input NOR gate (implemented in the illustrative embodiment a set of four NOR gates 326a, 326b, 326c and 326d for speed purposes) logically NORs the outputs of the NAND gates 324a–324h to generate a single output signal TCKD that is a delayed version of test clock signal TCK. For example, if "n" represents the value stored in delay register 302, then there are n+1 delay modules 322a, through 322n+1 incorporated in the generation of the signal TCKD being selected by the 3:8 decoder 312. The signal TCKD 329 is therefore a delayed version (by n+1 delay units) of the test clock TCK 350.

Clock signal generator circuit 330 includes inverters 332, 334, 338 and NOR gates 336 and 340 connected as shown in FIG. 3(a). A buffered and inverted version (via inverters 332, 334 and 338) of TCKD 329 is gated with test clock signal TCK via NOR gates 336, 340 to generate master clock TCKM and slave clock TCKS respectively.

Figure 3B:
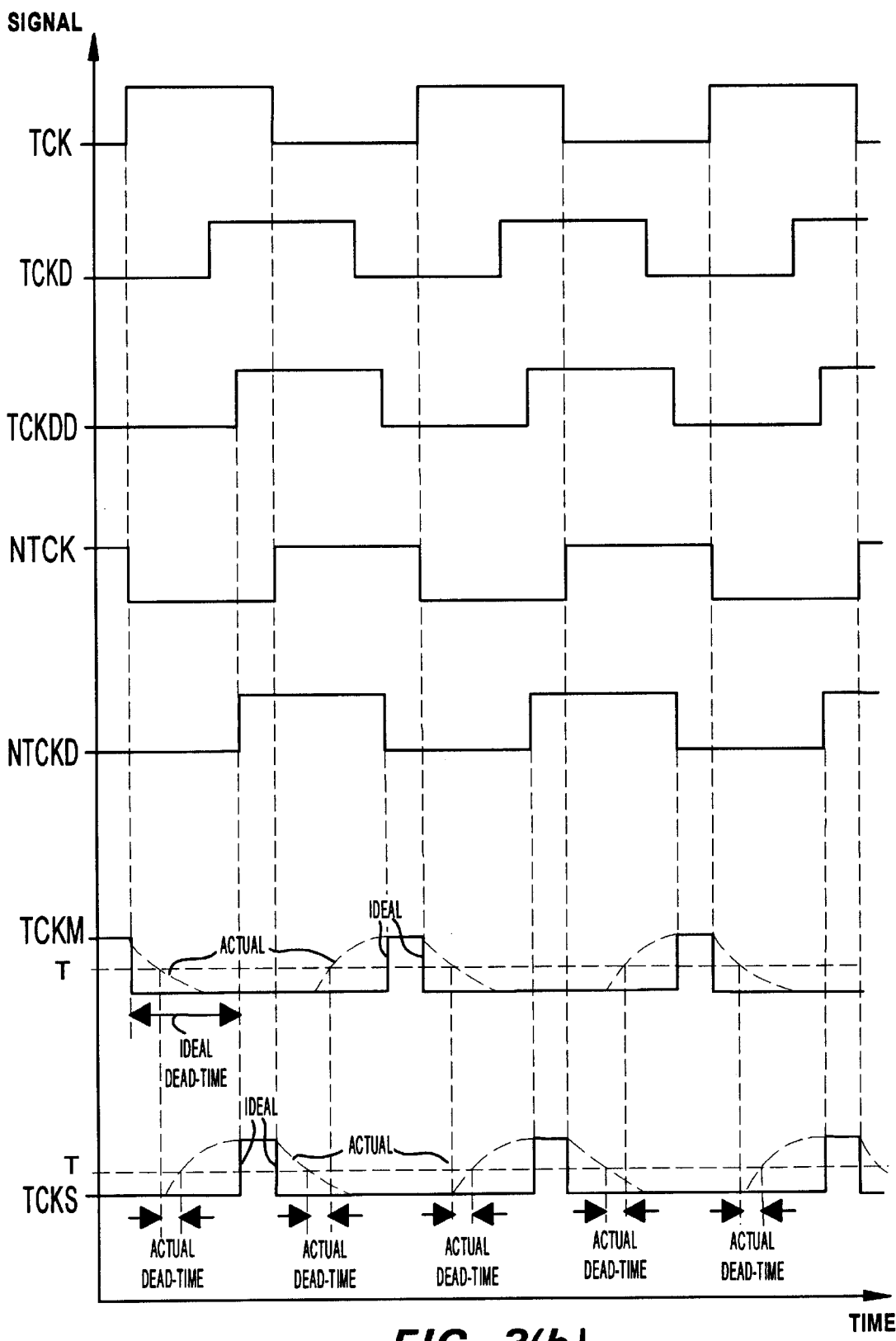
FIG. 3(b) is a timing diagram illustrating the timing of the master-slave flip-flop signals as a result of the use of the programmable delay apparatus invention.

FIG. 3(b) is a timing diagram illustrating the timing of the master and slave clock signals TCKM and TCKS when the TAP is implemented according to the present invention. As seen in FIG. 3(b), the master clock TCKM deasserts on the rising edge of TCK. This allows the TAP 130 to comply with the IEEE 1149.1 requirement that serial data be latched on the rising edge of the test clock TCK. The timing diagram illustrates the relationship between the test clock TCK and master and slave clocks TCKM and TCKS. It can also be seen that the delayed test clock TCKD is used to determine the dead-time between the master and slave clocks. In this example, the delay time is set to guarantee no shoot-throughs yet allow a maximum test clock TCK frequency to ensure the fastest testing time possible.

Figure 1:
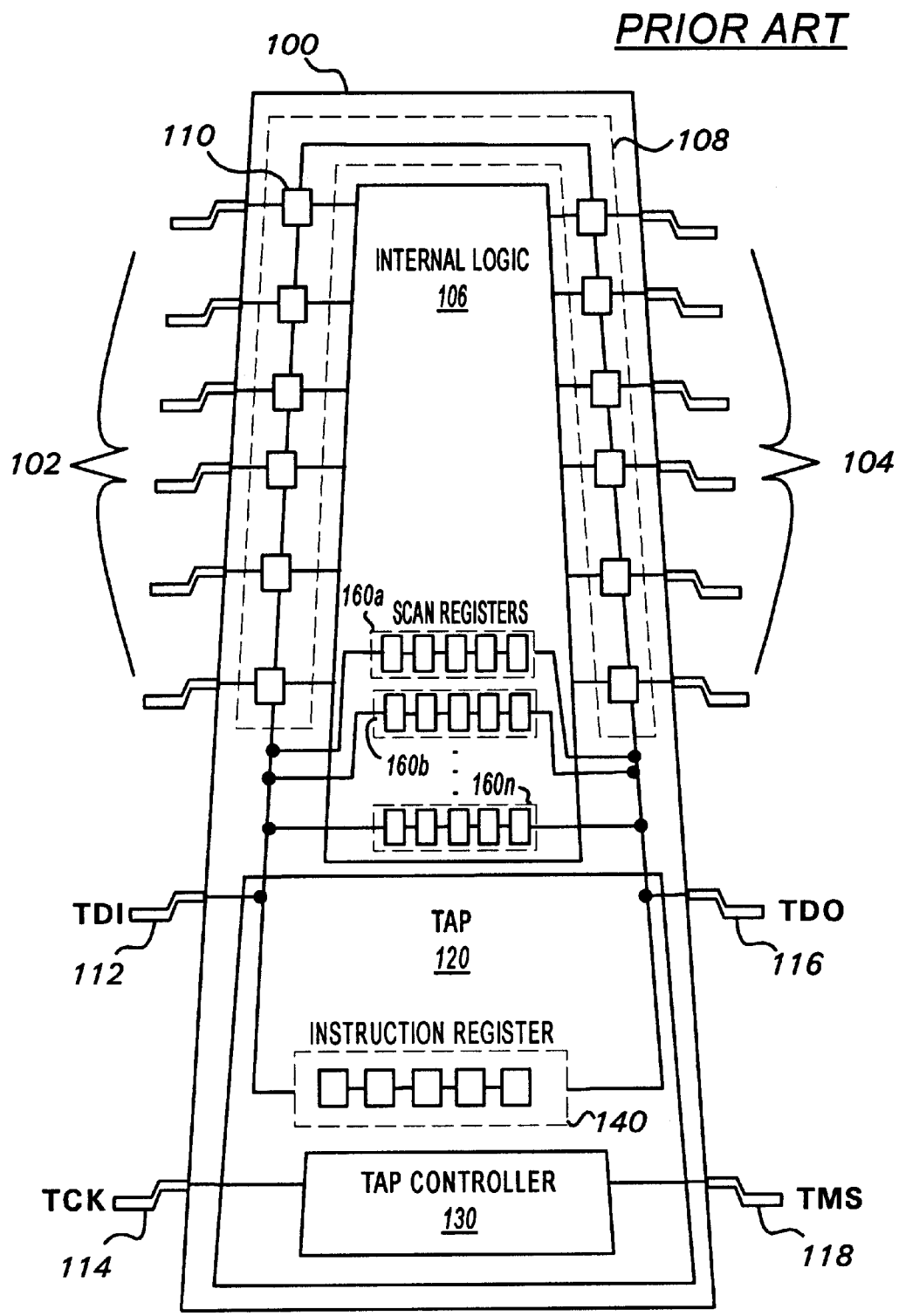
FIG. 1 is a block diagram of a prior art integrated circuit containing TAP circuitry.
Figure 2A:
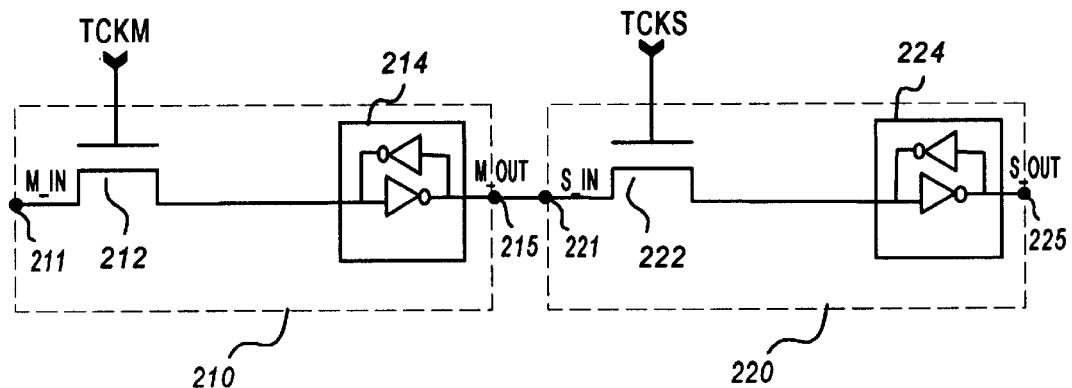
FIG. 2(a) is a schematic diagram of a master-slave flip-flop.
Figure 2B:
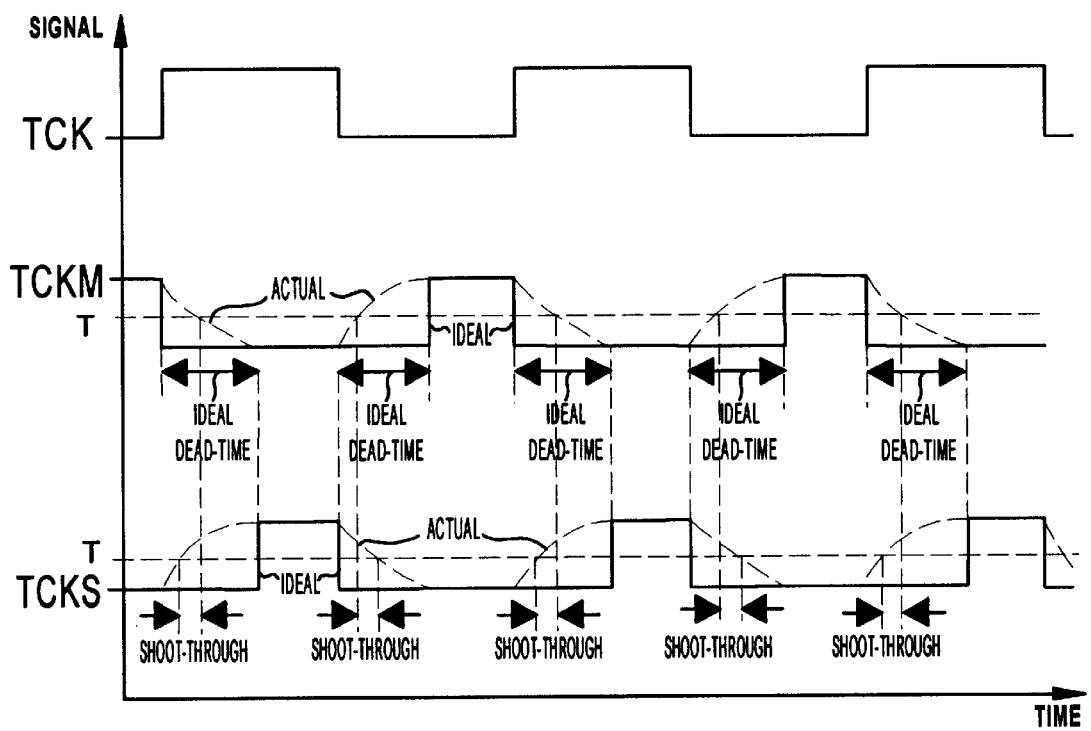
FIG. 2(b) is a timing diagram illustrating the "shoot-through" problem that can occur in master-slave flip-flops.
Figure 4:
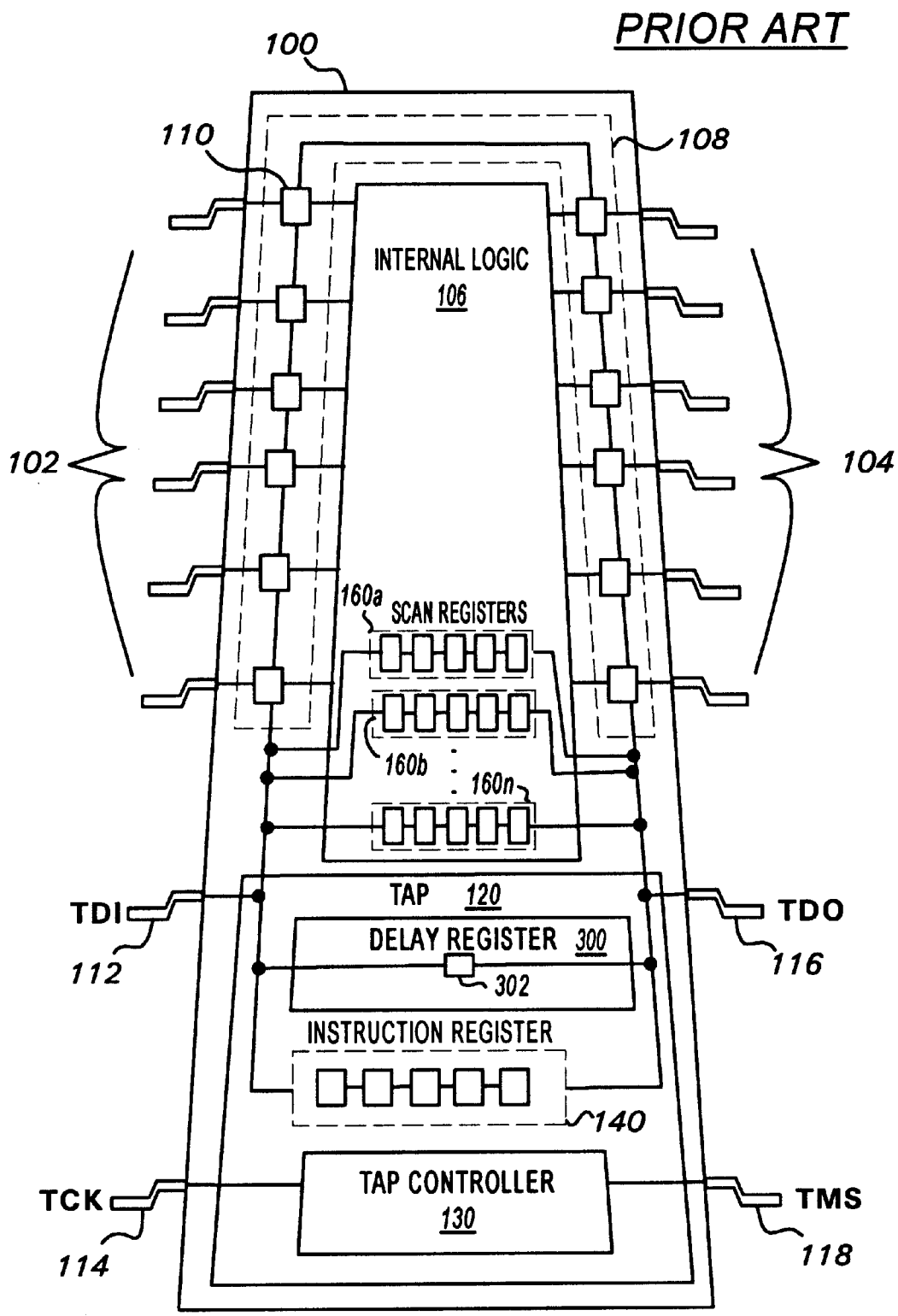
FIG. 4 is a block diagram of a boundary scan component which implements an master-slave clock generating circuit in accordance with the invention.

FIG. 4 is a block diagram of a boundary scan component 400 which implements the master-slave clock generating circuit 300 of the invention. When implemented for each boundary scan component in a larger circuit, such as that shown in FIG. 1(a), a buffered version of the master and slave clocks TCKM and TCKS is generated for each scan chain 108 for each boundary scan component U1, U2, U3 and U4. The individual chip designers need only ensure that the input load for master and slave are equivalent which is easily accomplished by placing equivalent buffers at the input to the boundary scan chain 108 in each component.

It will be appreciated from the above detailed description that the present invention provides significant advantages over the prior art. First, the dead-time required for a particular circuit can be fine-tuned by programming the delay time such that shoot-throughs are eliminated and the fastest time is achieved over a range of process-varying silicon. Second, all necessary logic is self-contained within the TAP 130 so designers need not be burdened by incorporating test modules in each of their blocks along with the associated amount of time in performing verification.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A master-slave clock generating circuit, comprising:
a programmable delay circuit comprising:
a delay selector circuit responsive to a programmed delay value to generate at least one adjustable delay control signal; and
a delay generator circuit which receives a test clock signal and said at least one adjustable delay control signal to generate a delayed clock signal, said delay generator circuit comprising:
a plurality of delay elements, each generating a successively delayed version of said test clock signal, and a delay generator decoder circuit which receives each of said successively delayed versions of said test clock and said at least one adjustable delay control signal to output only one of said successively delayed version of said test clock signal as said delayed clock signal; and
a clock signal generator circuit responsive to said test clock signal and said delayed clock signal to generate a master clock signal and a slave clock signal.

2. A master-slave clock generating circuit in accordance with claim 1, wherein:
said delay selector circuit comprises a decoder coupled to receive said programmed delay value and generates said at least one adjustable delay control signal.

3. A master-slave clock generating circuit in accordance with claim 2, comprising:
a delay register which stores said programmed delay value.

4. A master-slave clock generating circuit in accordance with claim 3, wherein:
said delay register is programmable via TAP control circuitry.

5. A master-slave clock generating circuit in accordance with claim 1, wherein:
said clock signal generator circuit comprises:
a first NOR gate coupled to receive said test clock signal and said delayed clock signal and to assert said master clock signal when said test clock signal and said delayed clock signal are both asserted;
a second NOR gate coupled to receive an inverted version of said test clock signal and said delayed clock signal and to assert said slave clock signal only when said test clock signal and said delayed clock signal are both deasserted.

6. A master-slave clock generating circuit for eliminating shoot-through events in a master-slave latch, comprising:
a programmable delay circuit responsive to a programmed delay value and a test clock signal to generate a delayed clock signal; and
a clock signal generator circuit responsive to said test clock signal and said delayed clock signal to generate a master clock signal and a slave clock signal, said clock signal generator circuit comprising:
a first NOR gate coupled to receive said test clock signal and said delayed clock signal and to assert said master clock signal when said test clock signal and said delayed clock signal are both asserted;
a second NOR gate coupled to receive an inverted version of said test clock signal and said delayed clock signal and to assert said slave clock signal only when said test clock signal and said delayed clock signal are both deasserted.

* * * * *